US006912077B2

(12) United States Patent
Weiss et al.

(10) Patent No.: US 6,912,077 B2
(45) Date of Patent: Jun. 28, 2005

(54) OPTICAL SYSTEM

(75) Inventors: Markus Weiss, Aalen (DE); Ulrich Haag, Aalen (DE)

(73) Assignee: Carl Zeiss SMT AG (DE)

(*) Notice: Subject to any disclaimer, the term of this patent is extended or adjusted under 35 U.S.C. 154(b) by 0 days.

(21) Appl. No.: 10/708,183

(22) Filed: Feb. 13, 2004

(65) Prior Publication Data

US 2005/0018269 A1 Jan. 27, 2005

Related U.S. Application Data

(63) Continuation of application No. PCT/EP02/08695, filed on Aug. 5, 2002.

(51) Int. Cl.[7] .................................................. G02B 26/08

(52) U.S. Cl. ........................ 359/212; 359/213; 359/214; 359/201; 359/204; 355/67

(58) Field of Search ................................. 359/169–226; 347/161–264, 110; 355/18–133; 250/559.27–559.37

(56) References Cited

U.S. PATENT DOCUMENTS

2002/0000507 A1 1/2002 Engelhardt

FOREIGN PATENT DOCUMENTS

| | | |
|---|---|---|
| EP | 0 678 768 A2 | 10/1995 |
| EP | 0 823 662 A2 | 2/1998 |
| EP | 1 081 553 A2 | 3/2001 |
| JP | 2-185016 | 7/1990 |
| JP | 9-82599 | 3/1997 |

*Primary Examiner*—James Phan

(74) *Attorney, Agent, or Firm*—Factor & Lake, Ltd.

(57) ABSTRACT

An optical system, for example a projection exposure apparatus for microlithography, has at least one optical element with an optical surface. A correction radiation device is provided that includes at least one correction radiation source for emitting correction radiation. A scanning device has at least one scanning mirror that is irradiated by the correction radiation and driven in such a way that a defined portion of the optical surface of the optical element is scanned with the correction radiation. This results in a correction of imaging characteristics of the optical element by means of heat which is supplied to the optical element by the correction radiation.

20 Claims, 3 Drawing Sheets

Fig. 1
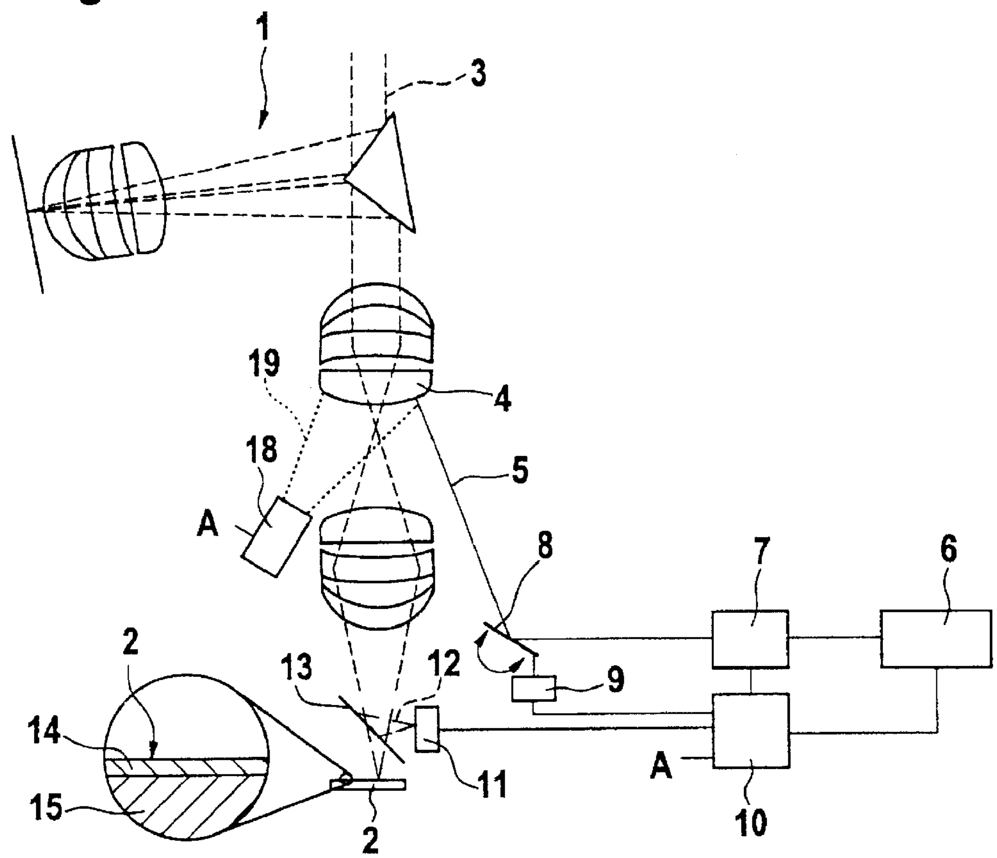
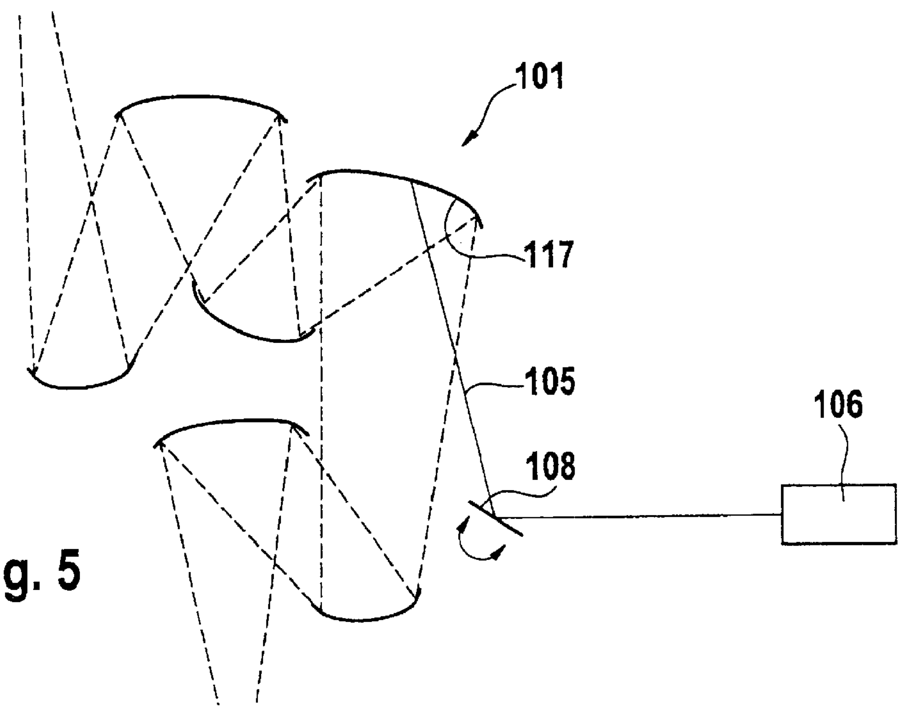
Fig. 5

206'
201
206"
204
205"
205'
208"
208'
219

306'
301
306"
304

308'
305'
305"
308"

OPTICAL SYSTEM

CROSS REFERENCE TO RELATED APPLICATIONS

This application is a continuation of pending International Application PCT/EP02/08695, with an international filing date of Aug. 5, 2002, which claims priority to German patent application number 101 40 208.2, filed on Aug. 16, 2001, wherein all of the above related applications are incorporated by reference.

BACKGROUND OF INVENTION

1. Field of the Invention

The invention relates to an optical system and in particular to a projection exposure apparatus for microlithography. More particularly, the invention relates to a projection exposure apparatus with rotationally asymmetrical illumination, e.g. having a slot-shaped image field.

2. Description of Related Art

An optical system of this kind is known from EP 0 823 662 A2. In that system, correction beams are directed through the projection objective parallel to the projection light. The correction radiation is absorbed by at least one optical element that is exposed to projection light. This influences the imaging characteristics of the optical element, an effect which is utilized for correction purposes.

Such a correction radiation device is very complicated to adjust and restricts the usable object field, since the correction rays are coupled into the projection optical system in the region of the optical field. Only very limited adaptation to changing correction requirements is possible with this arrangement.

SUMMARY OF INVENTION

It is therefore an object of the present invention to develop an optical system having an optical element and a correction radiation device including at least one correction radiation source, which correction radiation device supplies correction radiation to the optical element in such a way that the imaging characteristics of the optical element are corrected by means of the heat supplied to the optical element by the correction radiation, in such a way that flexible correction of the optical characteristics of the at least one optical element is made possible.

This object is achieved according to the invention in that the correction radiation device includes a scanning device having at least one scanning mirror, the scanning mirror being irradiated and driven in such a way that a defined portion of an optical surface of the optical element is scanned with correction radiation.

According to the invention the influence of the correction radiation device on the imaging characteristics of the optical element can be configured flexibly via driving the scanning mirror. The configuration of the surface portion of the optical element to be scanned or, for example, the optionally locally variable scanning speed, are available as degrees of freedom for the influence of the correction radiation on the imaging characteristics. In this way even imaging errors which deviate widely from rotational symmetry can be corrected. Rotationally asymmetrical imaging errors may arise, for example, through off-axis illumination, i.e. illumination inclined with respect to the optical axis of the projection optical system. Imaging errors which are induced by the projection light, as well as those which result from the arrangement or configuration of the at least one optical element without the influence of projection light, are correctable by means of the optical system according to the invention.

A plurality of cooperating correction radiation sources with associated scanning mirrors are preferably provided. Optical surfaces which, e.g. for reasons of accessibility or the shape of the optical surface, cannot be reached with a single correction radiation source can thereby be supplied with correction radiation. In this case the correction radiation device can also be used at flat angles of incidence, e.g. when the optical element must be irradiated directly and the distance between adjacent optical elements is small, or when reflections of the correction radiation in the direction of the optical axis of the projection optical system must be avoided. Even a more strongly curved surface of the optical element can be illuminated with correction radiation by using a plurality of correction radiation sources. In addition, it is possible to produce an embodiment of the correction radiation device in which a plurality of correction beams are superimposed at one point of the surface of the optical element to be irradiated. In this case the intensities of the individual correction beams can be so designed that an intensity having a perceptible correction effect is produced only at the point of superposition. The correction beams can therefore be directed through other optical elements without detectably influencing the imaging characteristics of same. Finally, when a plurality of correction radiation sources are used a plurality of optical elements can be irradiated.

A device for modulating the intensity of the correction light which cooperates with the scanning device may be provided. This further increases the flexibility of the correction radiation device. By varying the intensity of the correction radiation over the scanned surface portion, the thermal influencing of the irradiated surface can be selectively controlled.

The scanning device may be in signaling connection with a sensor device monitoring the optical system, the scanning device processing the signals received from the sensor device in order to activate the portion of the optical element to be scanned. This permits controlled operation of the correction radiation device in which the supply of correction radiation is controlled in dependence on its effect on the optical element. The sensor device may include, for example, a temperature measuring device for the at least one optical element. An example of such a device is a thermal imaging camera.

The sensor device may monitor the imaging characteristics of the optical system. Such monitoring permits very high-precision control of the operation of the correction radiation device.

The sensor device may be a position-sensitive optical sensor. Such sensors are obtainable in very inexpensive variants, for example, as quadrant detectors.

The sensor may be a CCD array. Such an array has high positional resolution and in addition has high photosensitivity.

Alternatively or additionally, the sensor device may monitor the temperature of the optical system, in particular of the optical element. The result of such monitoring can be converted into an input control signal for the scanning device by means of relatively simple algorithms.

In this case the sensor device may include a thermal imaging camera. A thermal imaging camera delivers sufficient local and temperature resolution for the stated monitoring purpose.

The correction radiation source is preferably a laser. With a laser a well-focused correction beam which can be accurately targeted even in confined spatial conditions can be generated. In addition, wavelengths which are efficiently absorbed by commonly-used optical materials for projection optical systems of projection exposure apparatuses, and are therefore especially well-suited to correction beams, can be generated using commercially available lasers.

The correction radiation source may have a variable wavelength. This provides an additional degree of freedom for influencing the imaging characteristics of the at least one optical element by means of the correction radiation. Depending on the set wavelength of the correction radiation and the absorption of the material of the at least one optical element resulting therefrom, a specific penetration depth for the correction radiation is produced which manifests itself in a specific influencing of the imaging characteristics of the optical element. This can be utilized, for example, for fine tuning of the correction effect.

The emission wavelength of the correction radiation source is preferably greater than 4 μm. Conventional optical materials for projection optical systems of projection exposure apparatuses have absorption edges in the wavelength range above 4 μm. At even greater wavelengths these materials absorb strongly, so that even with correction beams of low power heat induction into the irradiated optical element is relatively large, resulting in a corresponding correction effect. At a wavelength of the correction radiation in the vicinity of an absorption edge the penetration depth can be varied relatively strongly by a moderate change of the correction beam wavelength.

The optical system may include a plurality of optical elements through which the correction radiation passes, the wavelength of the correction radiation and the selection of the material of the optical elements being such that only the at least one optical element the imaging characteristics of which are to be corrected is supplied with heat by the correction radiation. In such a system the correction radiation can be directed through these non-absorptive or only slightly absorptive optical elements towards the optical element which is to be irradiated with correction radiation. Even optical elements which are not directly accessible can be supplied with correction radiation in this way.

The optical system may comprise a plurality of optical elements and the correction radiation may be so directed that only the at least one optical element the imaging characteristics of which are to be corrected is irradiated by the correction radiation. With this arrangement the selection of the material of the elements not supplied with correction radiation is not restricted.

The optical element the imaging characteristics of which are to be corrected may have a coating absorptive for the correction radiation. By means of such a coating a correction effect can be achieved even if the material of which the optical element is made does not itself absorb the correction radiation. The dependence of the absorption by the absorptive coating on wavelength can be predefined such that, if a variable correction radiation source is used, different absorption rates of the absorption coating are present within the range of variation. In this way the correction effect on the optical element can be additionally influenced by the absorptive coating via the wavelength of the correction radiation.

The optical system may include in known fashion a projection light source which illuminates a projection-light-sensitive layer on a substrate. In this case the projection-light-sensitive layer is so constituted according to the invention that it is not influenced by the correction radiation. The beam path of the correction radiation can be freely selected and there is no need to prevent the correction radiation or reflections thereof from impinging on the substrate.

The optical element may be a refractive optical element. Refractive optical elements can be supplied with correction radiation in such a way that they absorb said radiation either in a region close to the surface or only over a larger optical path length within the optical element. Each of these different forms of absorption behavior gives rise to a characteristically different correction effect of a corresponding correction radiation. This can be utilized selectively, depending on the imaging characteristic to be influenced.

Alternatively, the optical element may be reflective for the radiation of a projection light source. Impingement of correction radiation on such an optical element gives rise, via the deformation of the optical surface reflecting the projection light, to an optical correction effect which is significantly stronger than the optical correction effect of a refractive optical surface which is not deformed in the same way.

BRIEF DESCRIPTION OF DRAWINGS

Embodiments of the invention are elucidated in more detail below with reference to the drawings, in which:

FIG. 1 shows a schematic section of a projection exposure apparatus having a correction radiation device;

FIG. 5 shows a section similar to that of FIG. 1 of an alternative projection exposure apparatus having a correction radiation device;

DETAILED DESCRIPTION

Figure 2:
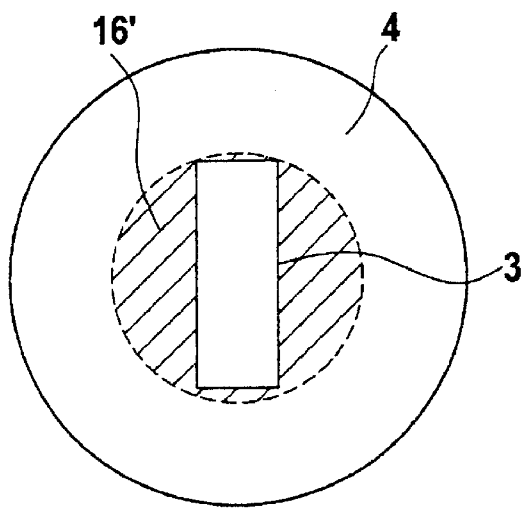
FIGS. 2 to 4 are top views of an optical element which is supplied with projection light and with correction radiation.

The projection optical system designated as a whole in FIG. 1 by reference numeral 1 forms part of a projection exposure apparatus for microlithography. The projection optical system 1 is used for imaging a structure of a mask (not shown in FIG. 1) on a wafer 2. The projection optical system 1 is composed of a plurality of reflective and refractive optical elements the precise individual arrangement of which is not of interest here.

For projection exposure, a projection light bundle 3 passes through the projection optical system 1. The projection light bundle 3 has a wavelength in the low ultraviolet range, e.g. 157 nanometres. The cross-section of the projection light bundle 3 in the region of a refractive surface of a lens 4 of the projection optical system 1 is represented in FIGS. 2 to 4: the projection light bundle 3 passes through this surface with a rectangular cross-section having an aspect ratio of approx. 1:3.

The projection light bundle 3 exposes a photoresist layer 14 of the wafer 2, which is applied to a substrate 15 (cf. the enlarged section in FIG. 1).

Figure 3:
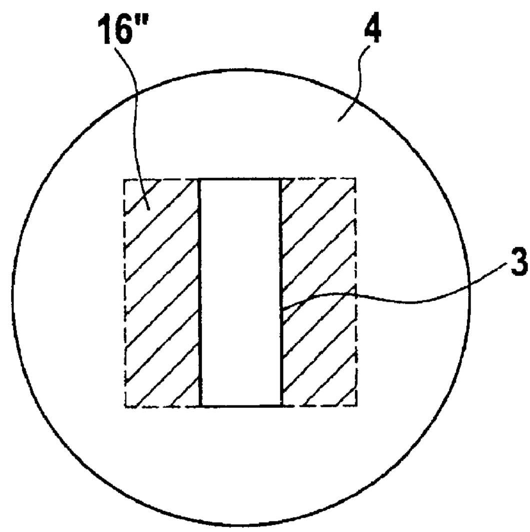
Figure 4:
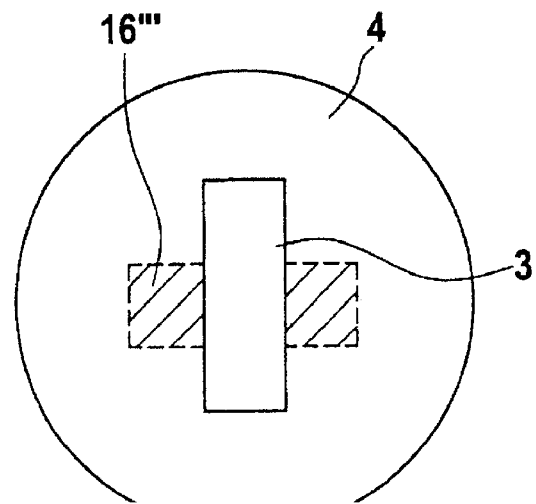

Directed on to the refracting surface of the lens 4 represented in FIGS. 2 to 4 is a correction beam 5 (cf. FIG. 1) which is generated by a laser 6. The correction beam 5 has a wavelength in the middle infrared range (3 to 30 μm), which is absorbed by the material of the lens 4. The laser 6 for generating the correction beam 5 may be, for example, a laser diode. Other laser light sources, e.g. a HeNe laser of 3.391 μm or a variable frequency-doubled $CO_2$ laser (typically variable between 4.6 and 5.8 μm) are available in this wavelength range.

The photoresist layer 14 is insensitive to the correction beam wavelength.

Before the correction beam 5 generated by the laser 6 impinges on the lens 4 it first passes through an optical modulator 7 whereby the intensity of the beam passing through can be influenced, and is then deflected by a scanning mirror 8. The latter is mechanically driven by a scanning control unit 9. Scanner technology of this kind is known, e.g. for laser displays.

The laser 6, the optical modulator 7 and the scanning control unit 9 are connected via signal lines to a central correction radiation control unit 10. The latter is connected to a CCD 11 camera via a data line. Said CCD camera 11 is exposed by a partial beam 12 of the projection light bundle 3, which partial beam 12 is coupled out of the projection light bundle 3 by means of a beam splitter 13 arranged in the beam path upstream of the wafer 2. The wafer 2 and the CCD camera 11 are arranged in mutually equivalent field planes of the projection optical system 1. The correction radiation device 10 is connected via a further data line (connection A—A) to a thermal imaging camera 18 the coverage cone 19 of which is indicated by dotted boundary lines in FIG. 1. The thermal imaging camera 18 detects the surface of the lens 4 irradiated by the correction beam 5.

Examples of surface portions 16', 16", 16'" of the lens 4 which can be scanned with the correction beam 5 are shown in FIGS. 2, 3 and 4: Surface portion 16' (cf. FIG. 2) is delimited on the outside by a circle circumscribed around the rectangular cross-section of the projection light bundle 3 and on the inside by the projection light bundle 3.

Surface portion 16" (cf. FIG. 3) has two rectangular partial portions having cross-sectional areas equal to that of the projection light bundle 3, the long sides of which border the opposed long sides of the rectangular cross-sectional area of the projection light bundle 3 in such a way that the partial portions combine with the cross-sectional area of the projection light bundle 3 to form a square.

Surface portion 16'" (cf. FIG. 4) includes two square partial portions the side-lengths of which correspond to those of the short sides of the rectangular cross-sectional area of the projection light bundle 3, and which are arranged on the long sides of the rectangular cross-sectional area of the projection light bundle 3 in such a way that this cross-sectional area combines with the two partial portions to form a cruciform structure having fourfold symmetry.

The correction beam 5 is deployed as follows:

During operation of the projection exposure apparatus imaging errors occur as a result of residual absorption of the projection light in the optical elements of the projection optical system 1. These errors are measured by means of the CCD camera 11 and the corresponding measurements are transmitted to the correction radiation control unit 10. The residual absorption of the projection light causes heating of the optical elements of the projection optical system. The heating of the lens 4 is measured by means of the thermal imaging camera 18 and the corresponding measurements are likewise transmitted to the correction radiation control unit 10.

The latter evaluates the measurement data and converts same into corresponding control signals for the scanning control unit 9, the optical modulator 7 and the laser 6. Depending on the type and symmetry of the imaging error measured or of the heating measured, the correction radiation control unit 10 initially selects a configuration of a surface portion 16 within which the correction beam 5 is to impinge on the lens 4. The scanning control unit 9 is then activated by the correction radiation control unit 10 in such a way that the latter causes the scanning mirror 8 to perform corresponding rocking motions to scan the selected surface portion 16. Synchronously with this mechanical driving of the scanning mirror 8, the correction radiation control unit 10 activates the optical modulator 7 in such a way that a specific intensity distribution of the correction beam 5 within the surface portion 16 is predefined, said intensity distribution being determined on the basis of the measurement data of the CCD camera 11 so as to compensate the imaging error measured.

In addition, the correction radiation control unit 10 activates the laser 6 to optimize the wavelength of the correction beam 5. The penetration depth of the correction beam 5 in the lens 4 can be predefined via the wavelength of the correction beam 5, since the lens material has differing absorption for wavelengths within the range of variation of the laser 6.

Through scanning of the predefined surface portion 16 (e.g. surface portion 16' in FIG. 3) by the correction beam 5, compensation of imaging errors occurring as a result of residual absorptions is achieved, as a rule, by homogenizing the temperature profile of the lens 4.

Alternatively to homogenization of the temperature distribution of the lens 4, a specified over-compensation can be produced by appropriate irradiation of the lens 4 with the correction beam 5, so that the imaging error thus produced in the lens 4 at least partially compensates the imaging error produced in the other optical elements of the projection optical system 1 by the projection light bundle 3.

A surface deformation of the lens 4 required for correction of imaging characteristics may also be effected by specified heating of deeper portions of the lens 4 by irradiation with a suitably convergent correction beam 5.

It is not necessary for the CCD camera 11 and the thermal imaging camera 18 to be installed at the same time. In principle, one of these two sensor devices is sufficient for operation of the projection exposure apparatus.

Figure 6:
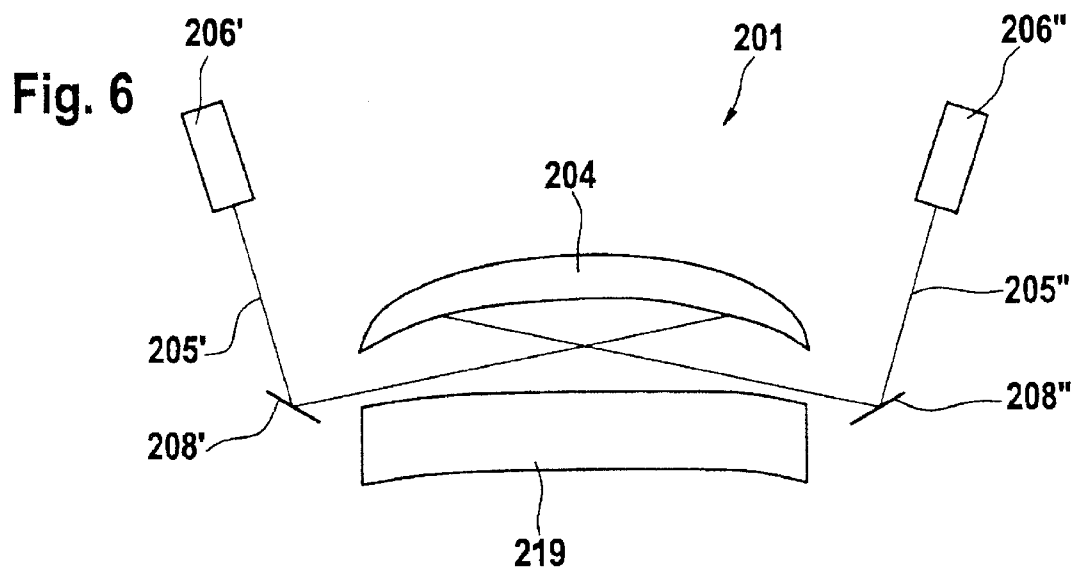
FIG. 6 shows an enlarged section of a projection optical system having an alternative correction radiation device.
Figure 7:
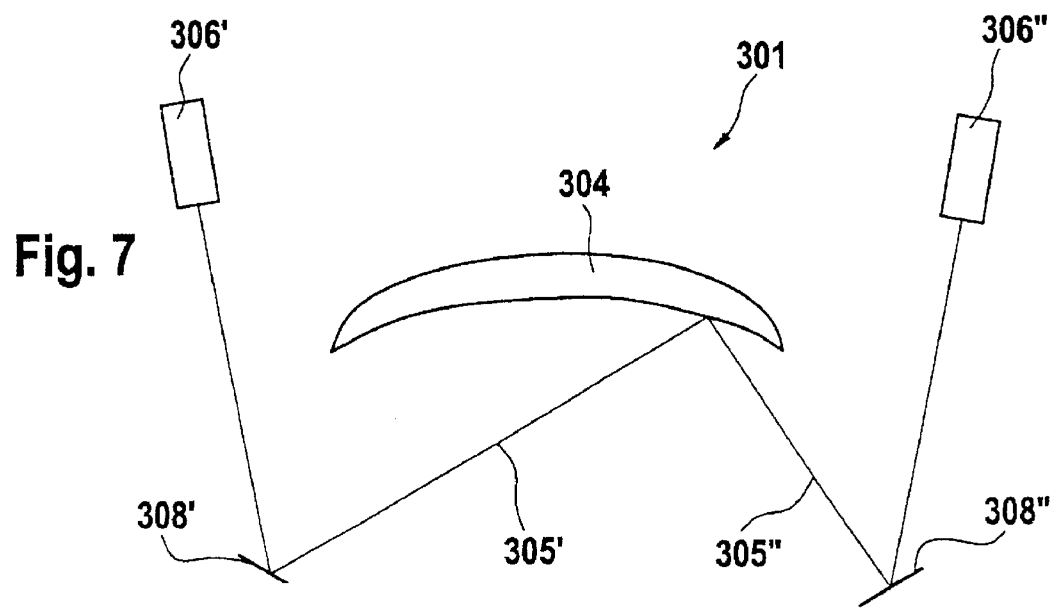
FIG. 7 shows an enlarged section of a projection optical system having a further alternative correction radiation device.

FIGS. 5 to 7 show alternative embodiments of a projection optical system having a correction radiation device. Components corresponding to those already explained with reference to FIGS. 1 to 4 carry reference numerals increased by 100 and are not elucidated again in detail.

FIG. 5 is a partial view of a projection exposure apparatus having a projection optical system 101 composed entirely of mirrors. The correction beam 105 is directed on to the reflecting surface of the mirror 117. Apart from the laser 106, the other components of the correction radiation device analogous to those of the embodiment according to FIG. 1 have been omitted.

FIG. 6 shows a partial section of a projection optical system 201 having two lenses 218, 219. The optical surface of the lens 218 facing towards the lens 219 is irradiated by two correction beams 205', 205". In this way said lens 218 is at all points accessible to at least one correction beam 205', 205", despite the very flat angle of incidence on the surface irradiated.

The correction beams 205', 205" are generated by two separate lasers 206' and 206". Alternatively, it is possible to generate both correction beams 205', 205" with a single laser and a suitably arranged beam splitter arrangement.

The correction beams 205', 205" are deployed in a manner analogous to that described in connection with FIGS. 1 to 4.

The scanning mirrors 208', 208" associated respectively with correction beams 205', 205" are so activated by a correction radiation control unit (not shown) that the partial surface portions irradiated thereby combine to form a surface portion as explained by way of example with reference to FIGS. 2 to 4. In addition, if a plurality of correction beams are used, the relative intensity of the correction beams can be adjusted and the temperature distribution of the irradiated lens 218 can be additionally influenced by a partial overlapping of the irradiated partial surface portions.

FIG. 7 shows a further variant of a correction radiation device. In this case a lens 304 is shown as part of a projection optical system 301 (not otherwise illustrated), one optical surface of which is irradiated by two correction beams 305', 305". Said correction beams 305', 305" are generated by two separate lasers 306', 306" and are deflected by respective scanning mirrors 308', 308". In this variant of the correction radiation device the correction radiation control unit (not shown) ensures that, in scanning the surface portion on the lens 304 to be irradiated, the correction beams 305', 305" are superimposed on one another on the surface to be irradiated. The intensity of the correction beams is therefore composed of the sum of the individual intensities of the correction beams 305', 305" only on the surface to be irradiated. At all other points in the beam path of the correction beams 305', 305" only the intensity of one of the two beams is present.

Alternatively to their use in correcting radiation-induced imaging errors, the above-described embodiments of the correction radiation device may also be used for specified adjustment of the projection optical system. In this case the imaging error of the projection optical system 1, which error is present independently of irradiation with the projection light bundle 3, is measured with the CCD camera 11. Said imaging error can then be corrected using the correction beam 5 in a manner analogous to that described above.

The correction radiation device which has been described can also be used for irradiating optical elements consisting of materials which absorb the correction beams either not at all or only weakly. In this case an optical coating which is transparent to projection light but which absorbs the correction beams is provided on the optical element to be irradiated with the correction beams. Such a coating is preferably implemented in such a way that, if a variable laser 6 is used, it has an absorption edge within the range of variation. In this case the depth of penetration of the correction beam into the optical element can be influenced especially effectively.

What is claimed is:

1. An optical system comprising:

at least one optical element having an optical surface, a correction radiation device including at least one correction radiation source for emitting correction radiation, a scanning device having at least one scanning mirror, the scanning mirror being irradiated by the correction radiation and driven in such a way that a defined portion of the optical surface of the optical element is scanned with the correction radiation, said scanning resulting in a correction of imaging characteristics of the optical element by means of heat supplied to the optical element by the correction radiation.

2. The optical system according to claim 1 comprising a plurality of cooperating correction radiation sources and scanning mirrors associated with the plurality of correction radiation sources.

3. The optical system according to claim 1 comprising a modulator cooperating with the scanning device for modulating the intensity of the correction radiation.

4. The optical system according to claim 1 in which the scanning device is in a signaling connection with a sensor device which monitors the optical system, the scanning device processing signals received from the sensor device for activating the portion to be scanned of the optical element.

5. The optical system according to claim 4 in which the sensor device monitors the imaging characteristics of the optical system.

6. The optical system according to claim 4 in which the sensor device includes a position-sensitive optical sensor.

7. The optical system according to claim 6 in which the position-sensitive optical sensor is a CCD array.

8. The optical system according claim 4 in which the sensor device monitors the temperature of the optical system.

9. The optical system according to claim 8 in which the sensor device includes a thermal imaging camera.

10. The optical system according to claim 1 in which the correction radiation source is a laser.

11. The optical system according to claim 1 in which the correction radiation has an emissions wavelength that can be varied by the correction radiation source.

12. The optical system according to claim 1 in which the correction radiation source has an emission wavelength being greater than 4 $\mu$m.

13. Optical system according to claim 1 comprising a plurality of optical elements through which the correction radiation passes, the emission wavelength of the correction radiation and the material selection of the optical elements being such that only the at least one optical element the imaging characteristics of which are to be corrected is supplied with heat by the correction radiation.

14. The optical system according to claim 1 comprising a plurality of optical elements and wherein the correction radiation is so directed that only the at least one optical element the imaging characteristics of which are to be corrected is irradiated by the correction radiation.

15. The optical system according to claim 1 in which the optical element the imaging characteristics of which are to be corrected has a coating absorptive for the correction radiation.

16. The optical system according to claim 1 comprising a projection light source which illuminates a layer on a substrate that is sensitive to projection light emitted by the projection light source but not sensitive to the correction radiation.

17. The optical system according to claim 1 in which the optical element is a refractive optical element.

18. The optical system according to claim 1 in which the optical element is reflective for projection light emitted by a projection light source.

19. The optical system according to claim 1 which forms a projection exposure apparatus for microlithography.

20. The optical system according to claim 19 having a rotationally asymmetrical illumination.

* * * * *

UNITED STATES PATENT AND TRADEMARK OFFICE

CERTIFICATE OF CORRECTION

PATENT NO. : 6,912,077 B2
DATED : June 28, 2005
INVENTOR(S) : Weiss et al.

It is certified that error appears in the above-identified patent and that said Letters Patent is hereby corrected as shown below:

Title page,
Item [63], Related U.S. Application Data, replace "Continuation of application No. PCT/EP02/08695, filed on August 5, 2002" with -- Continuation of application No. PCT/EP02/08695, filed on August 5, 2002, which claims priority to German patent application number 101 40 208.2, filed on August 16, 2001 --.

Signed and Sealed this

Second Day of May, 2006

JON W. DUDAS
*Director of the United States Patent and Trademark Office*